US012653004B2

(12) United States Patent
Hautala

(10) Patent No.: US 12,653,004 B2
(45) Date of Patent: Jun. 9, 2026

(54) PATTERNING LAYER MODIFICATION USING DIRECTIONAL RADICAL RIBBON BEAM

(71) Applicant: Applied Materials, Inc., Santa Clara, CA (US)

(72) Inventor: John Hautala, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 854 days.

(21) Appl. No.: 17/837,543

(22) Filed: Jun. 10, 2022

(65) Prior Publication Data

US 2023/0402284 A1     Dec. 14, 2023

(51) Int. Cl.
H10P 76/40     (2026.01)
G03F 7/20     (2006.01)
H10P 76/20     (2026.01)

(52) U.S. Cl.
CPC ............ H10P 76/4085 (2026.01); G03F 7/20 (2013.01); H10P 76/2041 (2026.01)

(58) Field of Classification Search
None
See application file for complete search history.

(56) References Cited

U.S. PATENT DOCUMENTS

| | | | |
|---|---|---|---|
| 5,284,544 A | 2/1994 | Mizutani | |
| 5,825,038 A | 10/1998 | Blake | |
| 6,909,086 B2 | 6/2005 | Samukawa | |
| 7,695,590 B2 | 4/2010 | Hanawa | |
| 7,767,561 B2 | 8/2010 | Hanawa | |
| 8,058,156 B2 | 11/2011 | Hanawa | |
| 9,406,535 B2 | 8/2016 | Berry, III | |
| 10,141,161 B2 | 11/2018 | Gilchrist | |
| 2003/0168011 A1 | 9/2003 | Lee | |
| 2008/0164819 A1 | 7/2008 | Hwang | |
| 2014/0272179 A1 | 9/2014 | Radovanov | |
| 2014/0353142 A1 | 12/2014 | Nakagawa | |

(Continued)

FOREIGN PATENT DOCUMENTS

| | | |
|---|---|---|
| JP | 08077961 A | 3/1996 |
| KR | 20150085793 A | 7/2015 |

(Continued)

OTHER PUBLICATIONS

International Search Report and Written Opinion for the International Application No. PCT/US2023/021924, mailed Sep. 5, 2023, 09 pages.

(Continued)

*Primary Examiner* — Binh X Tran
(74) *Attorney, Agent, or Firm* — KDW Firm PLLC

(57) ABSTRACT

Disclosed are approaches for forming semiconductor patterning features. One method may include providing a plurality of openings through a patterning layer of a semiconductor device, wherein each opening of the plurality of openings is defined by a sidewall of the patterning layer, and wherein the patterning layer is a resist layer or a carbon-based layer. The method may further include removing a portion of the patterning layer by directing a beam of neutral reactive radicals into the sidewall, wherein the beam of neutral reactive radicals is directed at a non-zero angle relative to a perpendicular extending from an upper surface of the patterning layer.

17 Claims, 3 Drawing Sheets

(56)            References Cited

U.S. PATENT DOCUMENTS

| | | | |
|---|---|---|---|
| 2015/0366044 A1* | 12/2015 | Kirkpatrick ......... | H01J 37/1474 |
| | | | 250/251 |
| 2016/0284520 A1 | 9/2016 | Likhanskii | |
| 2018/0076007 A1* | 3/2018 | Gilchrist ........... | H01J 37/32422 |
| 2018/0114676 A1 | 4/2018 | Kim | |
| 2018/0358208 A1 | 12/2018 | Ma | |
| 2019/0074189 A1 | 3/2019 | Park | |
| 2019/0164759 A1 | 5/2019 | Huang | |
| 2019/0237292 A1 | 8/2019 | Park | |
| 2020/0185201 A1* | 6/2020 | Kurunczi .......... | H01J 37/32541 |
| 2023/0130162 A1 | 4/2023 | Lee | |
| 2023/0369013 A1* | 11/2023 | Gilchrist ............. | H01J 37/3007 |
| 2023/0369022 A1* | 11/2023 | Gilchrist ........... | H01J 37/32422 |
| 2023/0386835 A1* | 11/2023 | Lin ................... | H01L 21/31105 |

FOREIGN PATENT DOCUMENTS

| | | |
|---|---|---|
| TW | 202008431 A | 2/2020 |
| WO | 2018048566 A1 | 3/2018 |
| WO | 2019125598 A1 | 6/2019 |
| WO | 2020117939 A1 | 6/2020 |

OTHER PUBLICATIONS

International Search Report and Written Opinion for the International Application No. PCT/US2023/021932, mailed Sep. 5, 2023, 10 pages.

* cited by examiner

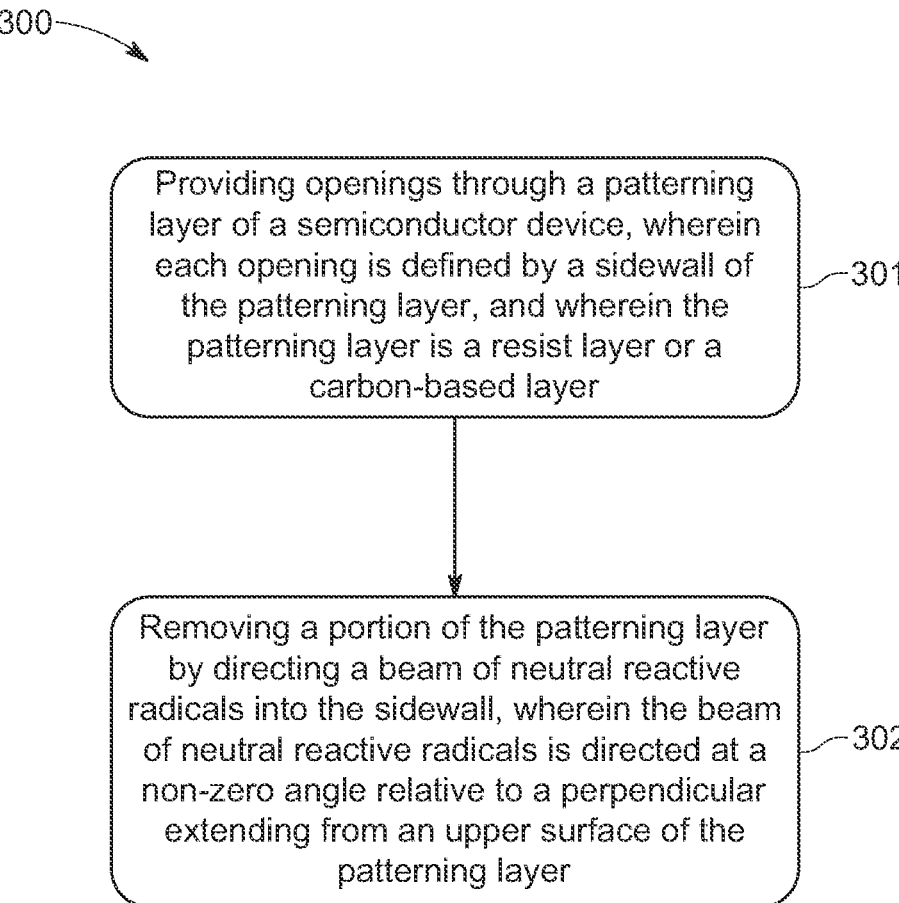

300

Providing openings through a patterning layer of a semiconductor device, wherein each opening is defined by a sidewall of the patterning layer, and wherein the patterning layer is a resist layer or a carbon-based layer

~301

Removing a portion of the patterning layer by directing a beam of neutral reactive radicals into the sidewall, wherein the beam of neutral reactive radicals is directed at a non-zero angle relative to a perpendicular extending from an upper surface of the patterning layer

PATTERNING LAYER MODIFICATION USING DIRECTIONAL RADICAL RIBBON BEAM

FIELD

Embodiments of the present disclosure generally relate to substrate processing equipment and techniques, and more particularly, to approaches for performing a directional radical ribbon beam removal process for patterning layer opening modification.

BACKGROUND

Fabrication of advanced three-dimensional semiconductor structures with complex surface topology and high packing density presents many technical challenges. Patterning using extreme ultraviolet lithography (EUVL) typically results in printed features that do not match the designed features. For example, trenches or vias in patterning layers may have an incorrect tip-to-tip distance, which results in incomplete overlap with vias or contact holes in layers above and below. This in turn may result in variable contact resistance, open circuits, and device failure. EUVL double patterning is one current approach used to correct this problem, but EUVL tools are expensive and time-consuming to run. In some cases, EUV photoresist pattern correction may be accomplished using an angled beam of reactive neutral species (e.g., oxygen radicals). However, precise angle control of reactive neutrals, generated in a plasma, is difficult to achieve.

Therefore, it would be beneficial to more precisely control the angle and angular distribution at which neutral reactive radicals are directed toward a workpiece. It is with respect to this and other considerations, the present disclosure is provided.

BRIEF DESCRIPTION OF THE DRAWINGS

By way of example, embodiments of the disclosure will now be described, with reference to the accompanying drawings, in which:

FIG. 3 is a flowchart depicting a method, in accordance with embodiments of the present disclosure.

Figure 1A:
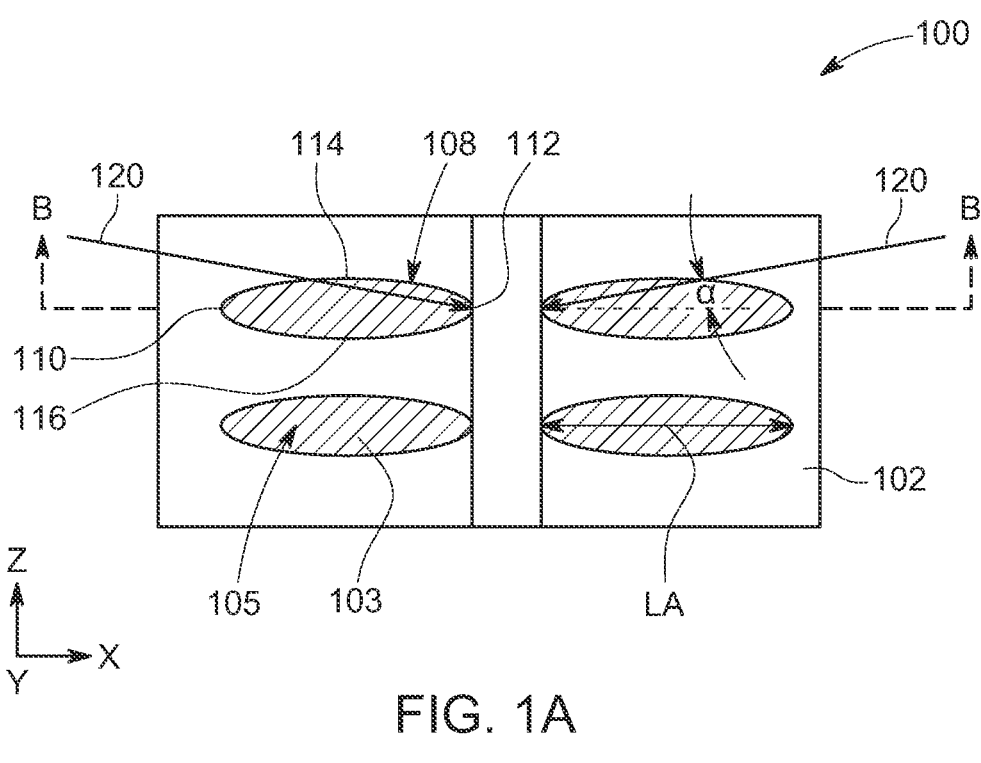
FIG. 1A depicts a top view of an exemplary semiconductor structure including a plurality of openings through a patterning layer, in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, structures, and systems in accordance with the present disclosure will now be described more fully hereinafter with reference to the accompanying drawings, where embodiments are shown. The methods, devices, structures, and systems may be embodied in many different forms and are not to be construed as being limited to the embodiments set forth herein. Instead, these embodiments are provided so the disclosure will be thorough and complete, and will fully convey the scope of the methods, devices, structures, and systems to those skilled in the art.

Embodiments described herein generally relate to angled processing (e.g., etching or ashing) of patterning features, such as trenches or vias, in a photoresist or carbon-based film using a collimated ribbon beam of zero to low energy radicals generated in a separate plasma chamber. In some embodiments, wafers may be scanned in front of the directed ribbon beam in a high vacuum environment to enable long mean free path of the plasma generated radicals. Uniform beams at angles from 0 to 85 degrees off normal to the wafer are used to ash or etch the patterning layer only on desired surfaces. In one non-limiting example, the angled processing may provide control of critical dimensions (CDs), such as tip-to-tip dimensions of trenches or vias, and/or contact hole elongation. Advantageously, the need for additional EUV patterning steps may be eliminated, and the removal process may be performed in the resist or film layer and not in the dielectric hardmask layer.

Figure 1B:
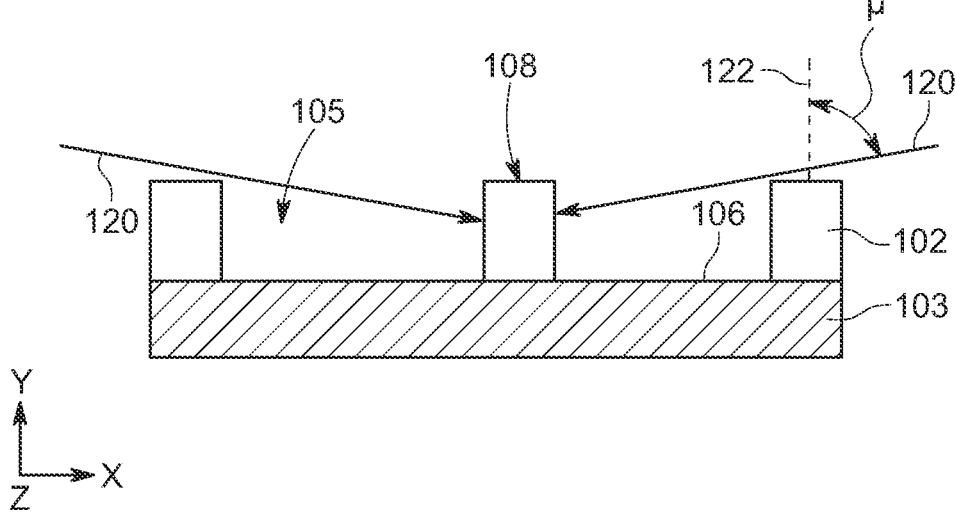
FIG. 1B depicts a side cross-sectional view along cutline B-B in FIG. 1A, in accordance with embodiments of the present disclosure.

FIGS. 1A-1B demonstrate a semiconductor device or structure 100, according to embodiments of the disclosure. Although non-limiting, the structure 100 may be a memory device (e.g., NAND or DRAM), logic device, or other type of semiconductor device. As shown, the structure 100 may include a patterning layer 102 formed over a second device layer 103, wherein the patterning layer 102 may be a photoresist or film (e.g., carbon-based film, silicon-based film, or metal film) having a plurality of openings (e.g., vias or contact holes) 105 formed therein. In some embodiments, the openings 105 are formed selective to a top surface 106 of the second device layer 103. Although only a pair of openings 105 are shown to simplify explanation of the structure 100, it will be appreciated that many additional openings 105 may be present across the structure 100.

Each of the openings 105 may be defined by a cylindrical or oval-shaped inner sidewall 108. As best shown in FIG. 1A, each opening 105 may include a first end 110 opposite a second end 112, and a first side 114 opposite a second side 116. A lengthwise axis 'LA' may extend between the first end 110 and the second end 112.

During processing, a beam of neutral reactive radicals 120 is directed into the sidewall 108 at the first end 110 and/or the second end 112 of one or more of the openings 105 to modify the material of the patterning layer 102. For example, the beam of neutral reactive radicals 120 may be delivered into the patterning layer 102 during an etch process or an ashing process to remove a portion of the sidewall 108. Non-limiting applications may include hole elongation, opening shape modification, defect removal (e.g., bridge defects), and others. In other embodiments, the beam of neutral reactive radicals 120 may be additionally, or alternatively, directed into the sidewall 108 at the first side 114 and/or the second side 116 of one or more of the openings 105.

In some embodiments, the beam of neutral reactive radicals 120 may be a collimated ribbon beam of no-energy or low-energy (0 to 100 eV) radicals of oxygen, nitrogen, or hydrogen delivered at a non-zero angle 'μ' relative to a perpendicular 122 extending from an upper surface 124 of the patterning layer 102, as best demonstrated in FIG. 1B. In some embodiments, the beam of neutral reactive radicals 120 may be further delivered at a second non-zero angle 'α' relative to the lengthwise axis, as best demonstrated in FIG. 1A. Said differently, the beam of neutral reactive radicals 120 may be delivered in the x-direction, the y-direction, and the z-direction. Furthermore, the beam of neutral reactive radicals 120 may be delivered in series of successive etch steps performed in between rotations of the structure 100 and/or a removal tool. For example, the etch may be performed every 180, 90, 45 degrees, etc. Embodiments herein are not limited in this context.

Figure 2:
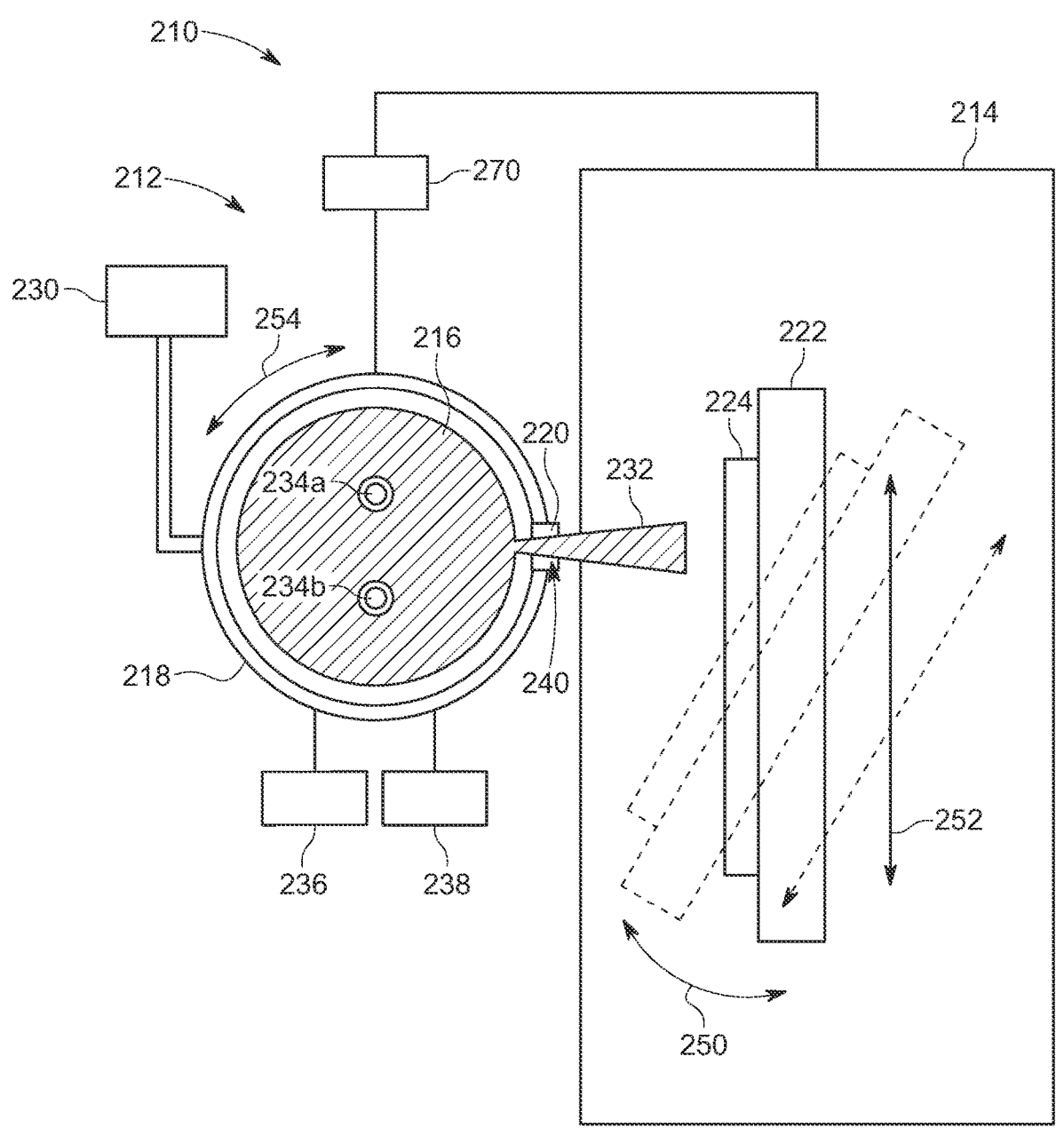
FIG. 2 is a schematic diagram of a system for directing neutral reactive radicals into the semiconductor structure, in accordance with embodiments of the present disclosure.

FIG. 2 illustrates a portion of a system 210 useful to perform processes described herein, such as to perform a directional radical ribbon beam removal process for patterning layer openings. The system 210 may generally include a plasma source 212 disposed adjacent a process chamber 214. The plasma source 212 may be adapted to generate an energetic plasma 216 in a plasma chamber 218, and to emit the plasma 216, e.g., through a nozzle 220 of the plasma chamber 218, or alternatively with a second plate (not shown) with a separate aperture situated a specific distance away from the process chamber 218. While the plasma chamber 218 is depicted as being generally cylindrical in shape, the present disclosure is not limited in this regard, and the plasma chamber 218 may be implemented in a variety of alterative shapes and configurations.

The process chamber 214 may contain a platen or wafer support 222 adapted to support a substrate 224 (e.g., a silicon wafer) in a confronting relationship with the nozzle 220 of the plasma chamber 218. In various embodiments, the platen 222 may be adapted to forcibly retain the substrate 224, such as via electrostatic clamping or mechanical clamping. Additionally, the platen 222 may include a heating element (not shown) for controllably heating the substrate 224 to a desired temperature (e.g., a temperature in a range between room temperature and 450 degrees Celsius) to enhance deposition processes.

The plasma source 212 of the system 210 may be configured to generate the plasma 216 from a gaseous species supplied to the plasma chamber 218 by one or more gas sources 230. The gaseous species may include one or more of SiH4, CH4, NH3, O2, N2, SiCl4, GeH4, Ar, WF6, etc. The present disclosure is not limited in this regard. The plasma 216 (and particularly free radicals within the plasma) may be projected through the nozzle 220 in the form of a ribbon beam 232 directed at the substrate 224 as further described below. In various embodiments, the plasma source 212 may be a radio frequency (RF) plasma source (e.g., an inductively coupled plasma (ICP) source, a capacitively coupled plasma (CCP) source, a helicon source, an electron cyclotron resonance (ECR) source, etc.). For example, the plasma source 212 may include electrodes 234a, 234b, an RF generator 236, and an RF matching network 238 for igniting and sustaining the plasma 216 in a manner familiar to those of ordinary skill in the art. The present disclosure is not limited in this regard.

The plasma 216 generated in the plasma chamber 218 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 218 of the system 210 is separate from the process chamber 214 where the platen 222 and the substrate 224 reside, and a collimated ribbon beam 232 containing free radicals of the plasma 216 is extracted from the plasma chamber 218 and is directed at the substrate 224 in a directionally specific, anisotropic manner. This is achieved by establishing a pressure differential between the plasma chamber 218 and the process chamber 214, and by collimating the radical beam.

In a non-limiting example, the radical beam may be extracted through a nozzle 220 or a second aperture plate having an elongated profile. With regard to the pressure differential, the process chamber 214 may be maintained at a first pressure, and the plasma chamber 218 may be maintained at a second pressure higher than the first pressure. In various examples, the first pressure in the process chamber may be in a range of $10^{-6}$ torr to $10^{-2}$ torr, and the second pressure in the plasma chamber 218 may be in a range of 1 millitorr to 1 torr. The present disclosure is not limited in this regard. Thus, the pressure differential between the plasma chamber 218 and the process chamber 214 may provide a motive force for driving free radicals in the plasma 216 from the plasma chamber 218 into the process chamber 214 in the form of a ribbon beam 232.

The ribbon beam 232 may be given its shape and may be collimated using various structures, devices, and techniques. In one example, the ribbon beam 232 may be given its shape and may be collimated by the elongated, low-profile nozzle 220 of the plasma chamber 218 or alternatively with a second plate set a specific distance away from 218 with a second aperture slot.

The platen 222 may be rotatable and movable for pivoting and scanning the substrate 224 relative to the plasma chamber 218 as indicated by arrows 250 and 252. Additionally or alternatively, the plasma chamber 218 may be rotatable about its long axis as indicated by the arrow 254. Thus, the collimated, free radical-containing ribbon beam 232 may be projected onto the substrate 224 at various oblique angles in a highly directional, anisotropic manner to etch or ash specific portions of surface features (e.g., sidewall 108 of openings 105 of the structure 100) of the substrate 224 while keeping other sides and/or portions of such surface features free from being etched or ashed. In a non-limiting example, the movement and/or rotation of the platen 222 and/or the plasma chamber 218 may facilitate projecting the ribbon beam 232 onto the substrate 224 at angles in a range of 0 degrees to 85 degrees relative to a surface of the platen 222 with angle spreads in a range of +/−5 degrees to +/−30 degrees.

Turning now to FIG. 4, a method 300 of forming a semiconductor structure according to embodiments of the present disclosure will be described. At block 301, the method may include providing a plurality of openings through a patterning layer of a semiconductor device, wherein each opening of the plurality of openings is defined by a sidewall of the patterning layer, and wherein the patterning layer is a resist layer or a carbon-based layer. The openings may be trenches, vias, or contact holes, and may be formed by any variety of known methods. In some embodiments, the resist layer is an EUV photoresist layer.

At block 302, the method 300 may include removing a portion of the patterning layer by directing a beam of neutral reactive radicals into the sidewall, wherein the beam of neutral reactive radicals is directed at a non-zero angle relative to a perpendicular extending from an upper surface of the patterning layer. The portion of the patterning layer may be removed by directing the beam of neutral reactive radicals into the sidewall during an ashing process or during an etch process.

In some embodiments, the beam of neutral reactive radicals is a collimated ribbon beam comprising low-energy radicals, which are generated in a separate plasma chamber. The radicals of the beam of neutral reactive radicals may be oxygen, hydrogen, or nitrogen.

In some embodiments, each opening has a first end opposite a second end and a first side opposite a second side, wherein the beam of neutral reactive radicals is directed into the sidewall at the first end or the second end. The beam of neutral reactive radicals may be additionally, or alternatively, directed into the first side and the second side.

In some embodiments, the beam of neutral reactive radicals may be directed into the sidewall at a second non-zero angle relative to an axis extending between the first end and the second end.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a plurality of openings through a patterning layer of a semiconductor device, wherein each opening of the plurality of openings is defined by a sidewall of the patterning layer, wherein the patterning layer is a resist layer or a carbon-based layer, and wherein an opening of the plurality of openings has a first end opposite a second end and a first side opposite a second side; and
   removing a portion of the patterning layer by directing a beam of neutral reactive radicals into the sidewall between the first end and the second end, wherein the beam of neutral reactive radicals is directed at a first non-zero angle relative to a perpendicular extending from a first plane defined by an upper surface of the patterning layer, wherein the beam of neutral reactive radicals is further directed into the sidewall at a second non-zero angle relative to a second axis extending along a second plane wherein the first plane and the second plane are different, and wherein the beam of neutral reactive radicals is a collimated ribbon beam comprising radicals having an energy less than 100 eV.

2. The method of claim 1, wherein the second plane is defined by a lengthwise axis that extends between the first end and the second end of the opening.

3. The method of claim 1, wherein the radicals are generated in a separate plasma chamber.

4. The method of claim 1, wherein each opening of the plurality of openings is one of the following: a trench, a via, or a contact hole.

5. The method of claim 1, wherein the beam of neutral reactive radicals is directed into the sidewall at the first end or the second end.

6. The method of claim 1, wherein the portion of the patterning layer is removed by directing the beam of neutral reactive radicals into the sidewall during an ashing process or during an etch process.

7. The method of claim 1, wherein the radicals of the beam of neutral reactive radicals are one of: oxygen, hydrogen, and nitrogen.

8. A method of forming a semiconductor device, comprising:
   providing a plurality of openings through a patterning layer, wherein each opening of the plurality of openings is defined by a sidewall of the patterning layer, wherein the patterning layer is a photoresist or a carbon-based film, and wherein an opening of the plurality of openings has a first end opposite a second end and a first side opposite a second side; and
   removing a portion of the patterning layer by directing a beam of neutral reactive radicals into the sidewall between the first end and the second end, wherein the beam of neutral reactive radicals is directed at a first non-zero angle relative to a perpendicular extending from a first plane defined by an upper surface of the patterning layer, wherein the beam of neutral reactive radicals is further directed into the sidewall at a second non-zero angle relative to a second axis extending along a second plane wherein the first plane and the second plane are different, and wherein the beam of neutral reactive radicals is a collimated ribbon beam comprising radicals having an energy less than 100 eV.

9. The method of claim 8, wherein the second plane is defined by a lengthwise axis that extends between the first end and the second end of the opening.

10. The method of claim 8, wherein radicals of the beam of neutral reactive radicals are generated in a separate plasma chamber.

11. The method of claim 10, wherein each opening of the plurality of openings is one of the following: a trench, a via, or a contact hole.

12. The method of claim 10, wherein the beam of neutral reactive radicals is directed into the sidewall at the first end or the second end.

13. The method of claim 10, wherein the portion of the patterning layer is removed by directing the beam of neutral reactive radicals into the sidewall during an ashing process or during an etch process.

14. The method of claim 10, wherein the neutral reactive radicals of the beam of neutral reactive radicals are one of: oxygen, hydrogen, and nitrogen.

15. A method of modifying openings of a semiconductor device, the method comprising:

providing a plurality of openings through a patterning layer, wherein each opening of the plurality of openings is defined by a sidewall of the patterning layer, wherein the patterning layer is a photoresist or a carbon-based film, and wherein an opening of the plurality of openings has a first end opposite a second end and a first side opposite a second side; and

removing a portion of the patterning layer by directing a beam of neutral reactive radicals into the sidewall between the first end and the second end during an ashing process or an etching process, wherein the beam of neutral reactive radicals is directed at a first non-zero angle relative to a perpendicular extending from a first plane defined by an upper surface of the patterning layer, wherein the beam of neutral reactive radicals is further directed into the sidewall at a second non-zero angle relative to a second axis extending along a second plane wherein the first plane and the second plane are different, and wherein the beam of neutral reactive radicals is a collimated ribbon beam comprising radicals having an energy less than 100 eV.

16. The method of claim 15, further comprising:

providing the semiconductor device in a process chamber; and generating, in a plasma chamber separate from the process chamber, radicals of the beam of neutral reactive radicals.

17. The method of claim 15, wherein each opening of the plurality of openings is one of the following: a trench, a via, or a contact hole, wherein each opening of the plurality of openings has a first end opposite a second end and a first side opposite a second side, and wherein the beam of neutral reactive radicals is directed into the sidewall at the first end or the second end.

* * * * *